(12) United States Patent
Murakami et al.

(10) Patent No.: US 6,569,535 B2
(45) Date of Patent: May 27, 2003

(54) SILICON WAFER AND EPITAXIAL SILICON WAFER UTILIZING SAME

(75) Inventors: Hiroki Murakami, Saga (JP); Kazuyuki Egashira, Saga (JP)

(73) Assignee: Sumitomo Metal Industries, Ltd., Osaka (JP)

(*) Notice: Subject to any disclaimer, the term of this patent is extended or adjusted under 35 U.S.C. 154(b) by 0 days.

(21) Appl. No.: 10/017,295

(22) Filed: Dec. 18, 2001

(65) Prior Publication Data

US 2002/0081440 A1 Jun. 27, 2002

(30) Foreign Application Priority Data

Dec. 20, 2000 (JP) .......................... 2000-387045

(51) Int. Cl.[7] .............................. C30B 15/20
(52) U.S. Cl. .................. 428/446; 428/64; 117/932; 423/348
(58) Field of Search ............ 428/446, 64; 117/3, 117/20, 932; 423/348

(56) References Cited

U.S. PATENT DOCUMENTS 5,919,302 A    7/1999  Falster et al.
5,968,264 A *  10/1999 Iida et al. .............. 117/30
6,066,306 A *  5/2000  Iida et al. .............. 423/328.1
6,190,452 B1 * 2/2001  Sakurada et al. ........ 117/20
6,277,715 B1 * 8/2001  Takeno et al. .......... 438/502

FOREIGN PATENT DOCUMENTS

JP    8-330316      12/1996
JP    11-147786      6/1999

OTHER PUBLICATIONS

Chiou, Herng–Der, The Effects of Preheatings on Axial Oxygen Precipitation Uniformity in CZochral ski Silicon Crystals, J. Electrochem, vol. 139, No. 6, Jun. 1992 pp. 1680–1684.*

* cited by examiner

Primary Examiner—Deborah Jones
Assistant Examiner—Stephan Stein
(74) Attorney, Agent, or Firm—Armstrong, Westerman & Hattori, LLP

(57) ABSTRACT

A silicon wafer characterized in that the laser scattering tomography defect occurrence region accounts for at least 80% of the wafer surface area and that the laser scattering tomography defects have a mean size of not more than 0.1 $\mu$m, with the density of those defects which exceed 0.1 $\mu$m in size being not more than $1\times10^5$ cm$^{-3}$, and wafers derived from this wafer as the raw material by heat treatment for oxide precipitate formation, by heat treatment for denuded layer formation or by epitaxial layer formation on the surface are useful as semiconductor materials.

18 Claims, 9 Drawing Sheets

SILICON WAFER AND EPITAXIAL SILICON WAFER UTILIZING SAME

FIELD OF THE INVENTION

The present invention relates to a silicon wafer to be used as a semiconductor material and having a very low surface defect density with bulk micro defects (BMDs) uniformly and sufficiently abundantly formed therein, and to an epitaxial silicon wafer derived from the silicon wafer by forming an epitaxial layer thereon.

DESCRIPTION OF THE PRIOR ART

Semiconductor silicon wafers are sliced from silicon single crystals and the method most widely employed for the production of such silicon single crystals is the Czochralski method (CZ method) of pulling single crystals.

The CZ method comprises dipping a seed crystal in a molten silicon placed in a quartz crucible and pulling up the seed crystal to thereby allow a single crystal to grow. With the advancement in the technology of pulling silicon single crystals, it has now become possible to produce less defective, dislocation-free, large single crystals. Semiconductor devices are produced from wafers or substrates prepared from single crystals via a large number of processes. In the course thereof, the substrates are subjected to a large number of physical treatments, chemical treatments and, further, thermal treatments, including treatments in a severe thermal environment, such as high temperature treatments at 1,150° C. or above. Thus, problems are produced not only by such defects as oxygen-induced stacking faults (hereinafter referred to as "OSFs"), which manifest themselves in device manufacturing processes and lower the performance characteristics of the devices, but also by micro defects, namely grown-in defects, which are formed in the step of crystal growth and greatly affect the performance characteristics of the devices.

FIG. 1 shows the results of an observation of the distribution of typical grown-in defects. This is a schematic representation of the results of an observation of the distribution of micro defects, by X-ray topography, on a wafer sliced from a single crystal just after growing, immersed in an aqueous solution of copper nitrate for deposition of copper and then subjected to heat treatment. On this wafer, OSFs are found distributed in a ring-like manner. Inside the ring, there are detected defects having a size of about 0.1 to 0.2 μm, called laser scattering tomography defects or crystal-originated particles (COPs), for instance, at a density of about $10^5$ to $10^6$ defects/cm$^3$ and, outside the ring, there is a region where there are about $10^3$ to $10^4$ defects/cm$^3$ called dislocation clusters with a size of about 10 μm.

OSFs are stacking faults caused by interstitial atoms and formed on the occasion of thermal oxidation treatment. When formed and grown on the wafer surface, which constitutes active regions of devices, they cause a leakage current and deteriorate the device characteristics. Dislocation clusters, another kind of grown-in defects, too, give no good devices when these are formed thereon. Laser scattering tomography defects act as a factor lowering the time-zero dielectric breakdown characteristic.

Generally, the sites of occurrence of the above defects are greatly influenced by the pulling rate on the occasion of single crystal pulling and by the temperature distribution within the single crystal just after solidification. For example, when a single crystal is grown while gradually lowering the pulling rate and it is examined for the distribution of various defects in a plane cut longitudinally along the pulling axis in the center of the crystal, the results schematically shown in FIG. 2 are obtained. Thus, in the stage of higher pulling rates after shoulder formation and attainment of a desired single crystal diameter, there are ring-forming OSFs in the peripheral portion of the crystal and the inside is a region where a large number of laser scattering tomography defects occur. With the decrease in pulling rate, the diameter of ring-forming OSFs becomes gradually smaller and finally null, whereupon the whole wafer surface becomes a region of occurrence of dislocation cluster defects alone, which corresponds to the region outside the ring-forming OSFs shown in FIG. 1. Thus, FIG. 1 shows the wafer sliced at position A in FIG. 2 or from a single crystal grown at the corresponding pulling rate.

In pulling up single crystals in the art, the pulling rate in single crystal growth has been increased and so controlled that the site of ring-forming OSFs, which is a region allowing high density occurrence of OSFs, may be shifted to the outer periphery of the crystal, since laser scattering tomography defects are not so adversely influential than dislocation clusters, and for the effect of productivity improvement.

However, various investigations have been made to provide methods of producing single crystals from which wafers can be obtained with the number of these defects being reduced as far as possible. Upon more detailed observation of the wafer shown in FIG. 1, there is found an oxygen precipitation promoted region, which is defect-free and in which oxygen precipitation tends to occur, just outside and adjacent to the ring-forming OSFs and, outside that region, there is an oxygen precipitation inhibited region, which is defect-free and in which oxygen precipitation hardly occurs, then followed by a region allowing the occurrence of dislocation cluster defects. There is also a denuded zone inside the ring-forming OSF region between that region and the laser scattering tomography defect region. The state of distribution of these ring-forming OSF region and the neighboring regions varies depending on the temperature distribution within the single crystal just after pulling up and/or the pulling rate and, in these oxygen precipitation promoted region and oxygen precipitation inhibited region, the occurrence of grown-in defects is very infrequent. Therefore, technologies have been developed to enlarge such portions to the whole single crystal to thereby obtain defect-free wafers.

Thus, according to the invention disclosed in Japanese Patent Application Laid-open No. H08-330316, for instance, the temperature gradient within crystal G (°C./mm) in the pulling axis direction in the temperature range from the melting point to 1,300° C. is controlled so that the ratio V/G (where V is the pulling rate (mm/min) in single crystal growth) in the internal portion from the center of the crystal to 30 mm from the periphery may amount to between 0.20 and 0.22 [mm$^2$/(°C.·min)] and this ratio may be gradually increased toward the periphery. By carrying out the pulling in that manner, the denuded zone comprising the oxygen precipitation promoted region and oxygen precipitation inhibited region outside the OSF ring alone can be extended to the whole section perpendicular to the pulling axis, hence to the whole single crystal. In this case, it is indicated that the positions of the crucible and heater, the position of the semiconical thermal radiator made of carbon and disposed around the growing single crystal, the structure of the thermal insulator around the heater and other various conditions should be examined by overall heat transfer calculations so that the above temperature conditions may be selected for the crystal growth.

If schematically illustrated in the same manner as in FIG. 2, the case where this method is employed may be illustrated as shown in FIG. 3. That is, when a single crystal grown while gradually decreasing the pulling rate is examined for the distribution of various defects in a section cut longitudinally along the crystal center pulling axis, it is found that the V-shaped region of occurrence of ring-forming OSFs as shown in FIG. 2 is converted to a U-shaped one by changing the temperature distribution within the single crystal just after pulling up. Thus, when a single crystal is grown at a pulling rate indicated by E, the whole crystal is occupied by a denuded zone and defect-free wafers can thus be obtained.

For attaining such a defect-free state, however, the condition ranges are restricted and it is not easy to stably realize the increase in pulling rate and the enlargement in single crystal diameter, for instance, on the place of mass production.

Recent trends toward decreases in temperature in device production steps and toward reductions in high temperature heat treatment time have rendered the effects of OSFs less injurious and made them less meaningful as factors deteriorating device characteristics. On the other hand, as the trend toward miniaturization of circuits increases, laser scattering tomography defects, which are grown-in defects, have become causative of decreases in the yield of conforming products and it is now an important problem to reduce the density of laser scattering tomography defects.

From such a viewpoint, Japanese Patent Application Laid-open No. H11-147786 discloses an invention according to which a silicon crystal is pulled up within the temperature range from the melting point of silicon to 1,400° C. in the center of the crystal so that V/G may amount to between 0.112 and 0.142 [$mm^2/(°C. \cdot min)$], when explained using the same symbols as used in the above-cited Japanese Patent Application Laid-open No. H08-330316. By doing so, it is intended that the form of the region of occurrence of ring-forming OSFs and the denuded zones on both sides thereof be enlarged to thereby obtain silicon single crystal wafers containing the ring-forming OSF occurrence region but free of the dislocation cluster defect occurrence region or laser scattering tomography defect occurrence region.

When schematically illustrated, the above invention is considered to consist in a method of producing single crystals under conditions close to those indicated by D in FIG. 3. It is alleged that when the occurrence of ring-forming OSFs is prevented by reducing the oxygen content to 24 ppma or below, defect-free wafers can be obtained under a relatively wide range of single crystal production conditions.

It has become known that those defects originating in the process of growing a single crystal and exerting great influences on the characteristics of devices formed on wafers taken from the single crystal can possibly be reduced by growing the single crystal so that the above-mentioned denuded zone intrinsic in the single crystal can be enlarged.

While one of the characteristics required as wafers is that they have a minimized number of defects, as mentioned above, it is also important that they, as device substrates, have a gettering effect on the heavy metal contamination which is unavoidable in the production process. Defects called bulk micro defects (BMDs) which occur in the wafer are effective on this gettering effect, and oxide precipitates formed in the region of occurrence of laser scattering tomography defects are considered one species thereof.

Meanwhile, the denuded zone outside the region of occurrence of ring-forming OSFs on a wafer is divided into two regions, namely the oxygen precipitation promoted region adjacent to the OSF occurrence region and the oxygen precipitation inhibited region outside the promoted region. While, in the oxygen precipitation promoted region, oxide precipitates forming BMDs can be obtained, the formation of BMDs in the oxygen precipitation inhibited region tends to be difficult. In practicing the invention described in the above-cited Japanese Patent Application Laid-open No. H08-330316 which comprises extending the denuded zone outside the ring-forming OSF occurrence region, it is expected that there may occur parts inferior in gettering capability due to the insufficient occurrence of BMDs, since the above-mentioned oxygen precipitation inhibited region is contained in the product. Further, according to the invention disclosed in Japanese Patent Application Laid-open No. H11-147786, both the denuded zones inside and outside the ring-forming OSF occurrence region are to be expanded, so that wafers differing in gettering effect from place to place may possibly be obtained.

SUMMARY OF THE INVENTION

The active layer on the wafer surface on which devices are to be formed is required to be as low as possible in defect density. Further, wafers having an active layer with a reduced defect density can also be produced by rapid temperature raising and lowering heat treatment or rapid thermal annealing (RTA) treatment for defect-free layer formation, or by epitaxial layer formation. Even in the case of such layer formation, defect-free better wafers can be obtained when the substrate defect density is as low as possible. On the other hand, it is desirable that, in any of these wafers, a sufficient number of BMDs be formed therewithin to show a good gettering effect.

It is an object of the present invention to provide a wafer having a very low surface defect density with BMDs formed uniformly and sufficiently abundantly as well as a method of producing the same.

The present inventors made various investigations in an attempt to establish a method of producing single crystals from which wafers having a minimized density of grown-in defects, such as dislocation clusters and laser scattering tomography defects, and having a sufficient number of BMDs to show a gettering capability can be obtained.

A typical investigation was carried out as follows. First, single crystal growth was carried out to attain a diameter of 210 mm and a body length of 1,000 mm by continuously decreasing the pulling rate from 1.5 mm/min to 0.3 mm/min. In that case, the temperature distribution within the single crystal just after solidification was controlled so that, in the longitudinal section parallel to the pulling axis, the ring-forming OSF occurrence region might become U-shaped, as schematically shown in FIG. 3, and the area free of either of the dislocation cluster defect occurrence region and the laser scattering tomography defect occurrence region might be enlarged.

When wafers are sliced from such a single crystal perpendicularly to the pulling axis, the wafer sliced at the position C in the figure corresponds to the wafers produced on the mass production sites of the prior art. The position B corresponds to a wafer resulting from a higher pulling rate and a higher cooling rate, the position D to a wafer comprising a denuded zone containing a ring-forming OSF occurrence region, and the position E to a defect-free wafer comprising a denuded zone outside the ring-forming OSF occurrence region. Wafers were sliced at the respective positions B, C, D and E of that single crystal and examined for the occurrence of defects, the formation of BMDs and the time-zero dielectric breakdown (TZDB) characteristic and so on, and further for the conformity to heat treatment for defect-free layer formation or to epitaxial layer formation.

The wafer sliced at the position B, in which the ring-forming OSF occurrence region is found approximately on the periphery, is a wafer uniform from the viewpoint on the defect distribution and containing BMDs formed uniformly in radial directions. However, because of the high density occurrence of laser scattering tomography defects small in size, it has been scarcely possible to obtain wafers satisfactory in time zero dielectric breakdown characteristic.

The wafer at the position D gave good results, namely it was almost free of grown-in defects. However, the formation of BMDs was site-dependent, namely the central portion of the wafer had a larger number of them but the peripheral portion had a smaller number of them. The wafer at the position E is excellent from the viewpoint on the defect-freeness but the drawback thereof is that a sufficiently large number of BMDs cannot be formed.

Based on such examinations, it may be said that the wafers at the position C, which are generally used in ordinary production processes, are suited for practical use from the viewpoint of sufficient BMD formation under the control of oxygen content, of the homogeneity of each wafer as a whole and, further, of productivity and so on. There is the problem, however, that when they are used as substrates for epitaxial wafers, many traces of defects remain upon epitaxial layer formation, hence satisfactory layers are not always obtained.

When the wafers corresponding to the position C were examined using the above-mentioned single crystal showing a U-shaped region of occurrence of ring-forming OSFs, it was found that laser scattering tomography defects become greater and the density thereof decreases as the pulling rate decreases, namely as the position comes close to the OSF ring. As the position further came close to the ring of OSFs and the diameter thereof decreased, the central portion became a denuded zone where almost no defects appeared. It seemed, however, that there be a region where defects are small in size and low in density between the region of occurrence of laser scattering tomography defects and the denuded zone.

On the other hand, in growing single crystals, it is one of objects to easily obtain defect-free single crystals having no grown-in defects, and for enlarging the denuded zone which is adjacent to the ring-forming OSF occurrence region, investigations were also made in order to enlarge the horizontal portion of the U-shaped bottom portion in the U-shaped distribution shown in FIG. 3. As a result, it was found that the U-shaped bottom horizontal portion can be expanded if two conditions are satisfied simultaneously, namely if the temperature gradient in the pulling axis direction in a temperature range just after solidification is increased as far as possible and if the temperature gradient in the pulling axis direction in the central portion of the single crystal is made greater than that in the peripheral surface portion.

Accordingly, single crystal growth was attempted while varying the pulling rate in the same manner as shown in FIG. 3, using the cooled portion, namely the hot zone, of the single crystal where the temperature distribution becomes such that the horizontal portion of the U-shaped bottom is enlarged. An example of that case is schematically shown in FIG. 4. It was thus found that when the single crystal is grown under conditions that the horizontal portion of the U-shaped bottom can be enlarged, a region where defects small in size are distributed at a low density occurs enlarged between the denuded zone above the ring-forming OSF occurrence region and the laser scattering tomography defect occurrence region.

A wafer was sliced from that low-defect region (hereinafter referred to as "X region") and this wafer (X wafer) was examined in detail. It was found that although the defect size was almost the same or smaller as compared with the above-mentioned wafer at the position B, in FIG. 3, of the single crystal pulled up at a high rate, the defect occurrence density was by far lower. When tested for time-zero dielectric breakdown, the X wafer gave good results as anticipated from the state of defects. Further, upon oxygen precipitation treatment, satisfactory BMDs could be formed. It was thus revealed that an ideal wafer can be obtained in the above manner.

The reason why a region with small defects distributing therein at a low density is formed between the denuded zone and the laser scattering tomography defect occurrence region, as mentioned above, is still unknown. However, for causing the ring-forming OSF occurrence region to have a shape resulting from enlargement of the horizontal portion of the U-shaped bottom, as shown in FIG. 4, it is necessary to increase the temperature gradient in the pulling axis direction just after solidification and to further control the temperature gradient in a manner such that the central portion of the single crystal shows a greater temperature gradient than the peripheral surface portion, and the behaviors of vacancies and interstitial silicon atoms within the single crystal having such temperature distribution conditions just after solidification may presumably contribute to the formation of the region in question.

It is not always easy to increase the temperature gradient in the pulling axis direction and control that temperature gradient in a manner such that the central portion of the single crystal shows a greater gradient than the peripheral surface portion. Since the heat of the single crystal just after solidification is lost mainly from the surface, it becomes necessary to enhance the heat transfer from the single crystal surface so that the temperature gradient in the pulling axis direction may be increased. However, this means that the surface is cooled more intensely and, as a result, the temperature gradient in the surface portion becomes greater than the single crystal inside.

On the contrary, the present inventors made investigations concerning the relative positions of the crucible and heater, the utilization of a heat shield, namely the shape of the heat shield, the distance between the melt surface and heat shield, the distance between the heat shield or cooling member and the single crystal surface and other factors and, as a result, realized a temperature distribution such that the temperature gradient in the central portion is greater than in the surface portion. And, first, a single crystal is grown while varying the pulling rate, and the pulling rate at which the desired region can be obtained is determined. By carrying out growing at that rate, it becomes possible to attain such a defect distribution state over the whole single crystal length.

Wafers sliced from the single crystal obtained in that manner are very small in the number of grown-in defects. When these wafers were subjected to heat treatment for oxide precipitate formation, BMDs could be formed to a satisfactory extent to give less defective wafers excellent in gettering effect. Furthermore, heat treatment for defect-free layer formation could readily result in the formation of a defect-free layer on the surface and, thus, wafers abundant in BMDs and suited for use as semiconductor substrates could be obtained. Moreover, epitaxial layer formation treatment gave a defect-free good epitaxial layer and, after further heat treatment for oxide precipitate formation, epitaxial silicon wafers excellent in gettering effect were obtained.

Based on such findings as mentioned above, the inventors further established the critical conditions for obtaining still better wafers in a stable manner and have now completed the present invention. The present invention consists of:

(1) A silicon wafer sliced from a silicon single crystal pulled up and grown by the CZ method, characterized in that the laser scattering tomography defect occurrence region accounts for at least 80% of the wafer surface area and that the laser scattering tomography defects have a mean size of not more than 0.1 μm, with the density of those defects which exceed 0.1 μm in size being not more than $1 \times 10^5$ cm$^{-3}$.

(2) A silicon wafer as defined above under (1) which has an oxygen concentration of not less than 25 ppma (OLD ASTM).

(3) A silicon wafer as defined above under (1) or (2) which has an oxide precipitate density, as measured on a section, of not less than $1 \times 10^4$/cm$^2$ as resulting from heat treatment for oxide precipitate formation.

(4) A silicon wafer as defined above under (1) or (2) which has a defect-free layer on the surface as resulting from heat treatment for defect-free layer formation.

(5) An epitaxial silicon wafer which comprises an epitaxial layer formed on the surface of a silicon wafer as defined above under (1), (2), (3) or (4).

(6) An epitaxial silicon wafer which comprises an epitaxial layer formed on the surface of a silicon wafer as defined above under (1) or (2) and has an oxide precipitate density, as measured on a section, of not less than $1 \times 10^4$/cm$^2$ as resulting from heat treatment for oxide precipitate formation within the wafer following epitaxial layer formation.

(7) An epitaxial silicon wafer which comprises an epitaxial layer formed on the surface of a silicon wafer as defined above under (4) and has an oxide precipitate density, as measured on a section, of not less than $1 \times 10^4$/cm$^2$ as resulting from heat treatment for oxide precipitate formation within the wafer following epitaxial layer formation.

(8) A silicon wafer as defined above under (1) or (2) as sliced from a silicon single crystal produced by pulling by the CZ method under pulling conditions such that while the temperature of the central portion of the single crystal being pulled up from the melt is within the range from the melting point to 1,370° C., the temperature gradient $G_c$ in the central portion in the single crystal pulling axis direction is not less than 2.8° C./mm and the ratio $G_c/G_e$, where $G_e$ is the temperature gradient in the peripheral portion in the pulling axis direction, is not less than 1.

DESCRIPTION OF PREFERRED EMBODIMENTS

The silicon wafer of the present invention is one sliced from a silicon single crystal pulled up by the CZ method in which a region of occurrence of small laser scattering tomography defects at a low density (X region) accounts for at least 80% of the wafer surface area, the mean size of the laser scattering tomography defects is not more than 0.1 μm and the density of occurance of those defects exceeding 0.1 μm in size is not more than $1 \times 10^5$ cm$^{-3}$.

Figure 1:
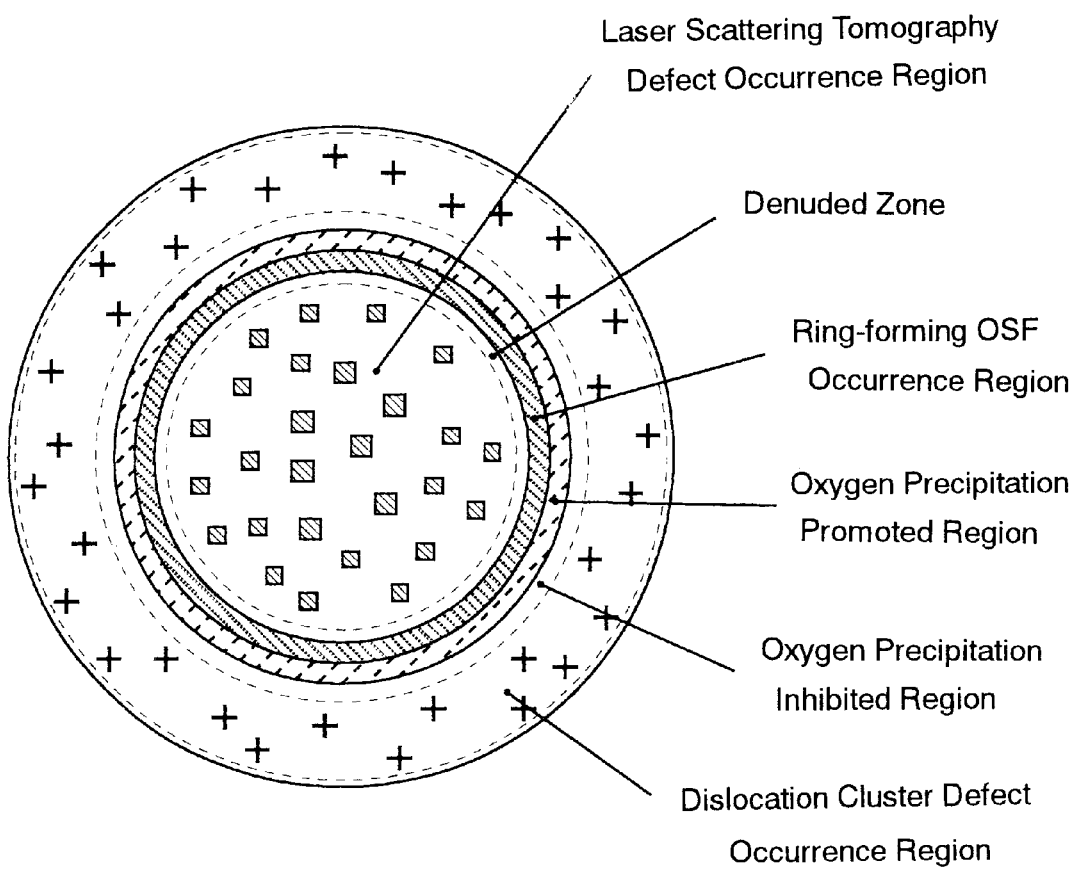
FIG. 1 is a schematic representation of a typical example of the distribution of defects as observed on a silicon wafer.
Figure 2:
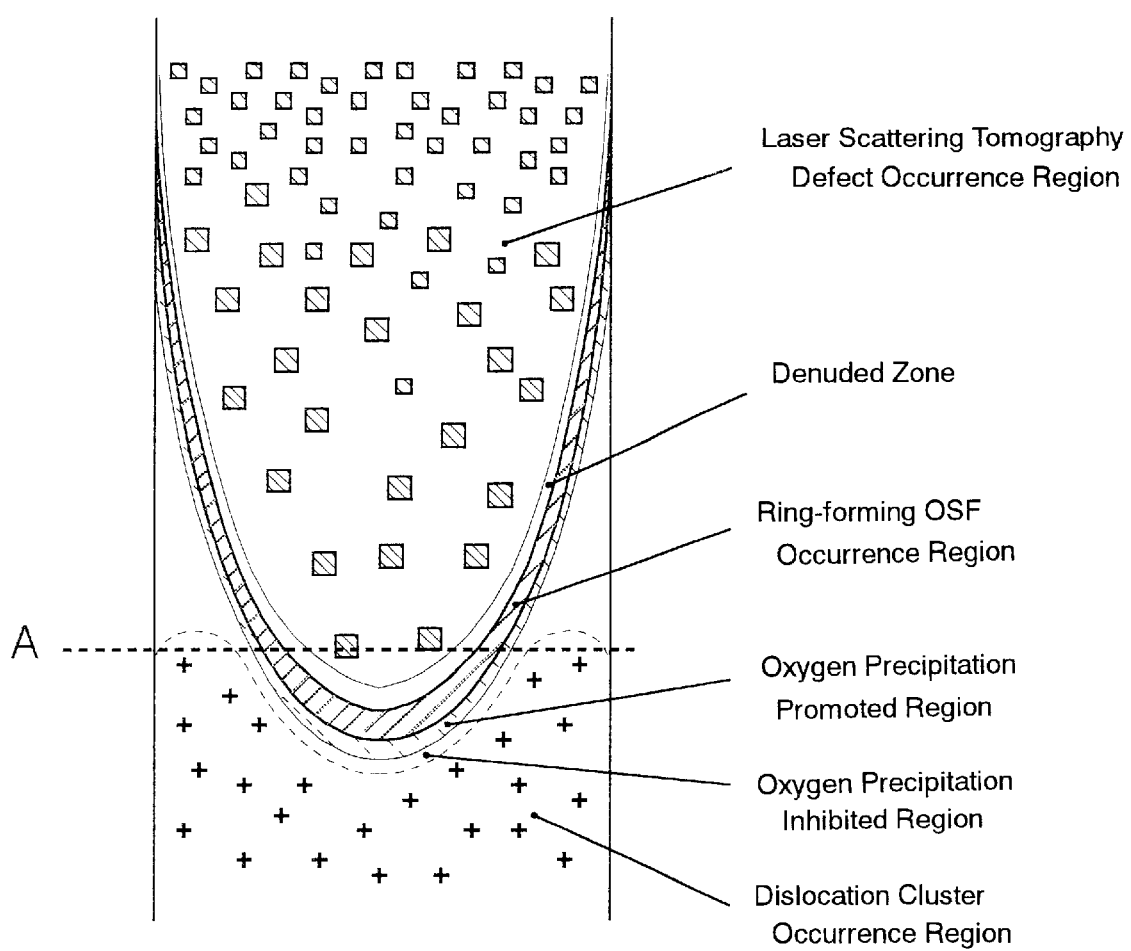
FIG. 2 is a schematic illustration of the general relationship between the pulling rate in silicon single crystal pulling and the sites of occurrence of crystal defects.

As for the distribution of defects occurring on a silicon wafer sliced from a single crystal perpendicularly to the pulling axis, generally, as schematically shown in FIG. 1, there are a dislocation cluster defect occurrence region in the peripheral portion of the disk-like shape, a laser scattering tomography defect occurrence region in the middle portion and a ring-forming OSF occurrence region between the above two regions. The width or diameter, size and position of these regions vary depending on the production conditions and, adjacent to the ring-forming OSF occurrence region, there are denuded zones without grown-in defect such as an oxygen precipitation promoted region.

In the wafer of the invention, the above-mentioned X region accounts for at least 80% of the wafer surface area and, around the same, there may be present a denuded zone, a ring-forming OSF occurrence region and/or an oxygen precipitation promoted region. If, however, the X region is less than 80%, an oxygen precipitation inhibited region and/or a dislocation cluster occurrence region is unfavorably included in the peripheral portion of the wafer. This is unfavorable because BMDs having a gettering capacity are prevented from precipitating in the oxygen precipitation inhibited region and dislocation cluster occurrence region and therefore it is no longer possible to obtain devices excellent in performance characteristics from the whole wafer surface. When the area of the X region is at least 80%, the peripheral portion will contain neither the oxygen precipitation inhibited region nor the dislocation cluster occurrence region.

Since wafers are produced after rounding treatment which comprises grinding the outside diameter of the single crystal after growth, the fact that the area of the X region is at least 80% means that the percentage is relative to the wafer surface area after outside diameter reduction, not to the section, perpendicular to the pulling axis, of the single crystal after pulling up.

When the laser scattering tomography defects are smaller in size on the average and the number of larger ones among them is smaller, the wafer becomes better in time-zero dielectric breakdown characteristic. The reason why the defects mentioned above should have a mean size of not more than 0.1 μm and the density of occurrence of those laser scattering tomography defects larger than 0.1 μm should be not more than $1 \times 10^5$ cm$^{-3}$ is that a substantially defect-free state can result under such conditions and, upon further heat treatment for defect-free layer formation, defect-free wafers can readily be obtained.

The size and occurrence density of the defects can be measured on an OPP apparatus (product of Bio-Rad Laboratories LTD; oxygen precipitate profiler) after polishing the specimen surface. This method can detect defects down to a size of 0.01 μm. It can be considered that smaller defects, even present, will not influence the time-zero dielectric breakdown characteristic.

It is desirable that oxygen be contained in the single crystal in an amount not less than 25 ppma (OLD ASTM) for causing a sufficient number of BMDs to be formed, when BMDs are not particularly necessary or the wafer strength is not required although the oxygen content in the single crystal may be lower. An excessive oxygen content, however, may cause formation of dislocation and other defects in the single crystal and, therefore, an oxygen content of at most 36 ppma is recommendable.

Since the position of ring-forming OSFs is practically determined in the process of cooling from solidification to 1,370° C., it is necessary to control the temperature distribution within the single crystal while the single crystal is in this temperature range. Further, in this temperature range, the single crystal should be pulled up while controlling the temperature gradient in the pulling axis direction to not less than 2.8° C./mm and the ratio $G_c/G_e$ to not less than 1, namely while maintaining the temperature gradient smaller in the peripheral portion than in the central portion of the single crystal. This is because if such a temperature distribution condition cannot be realized, the X region mentioned above cannot exceed 80% on the section perpendicular to the single crystal pulling axis, namely on the wafer surface.

At first, it seemed the higher temperature gradient, which is not less than 2.8° C./mm, is better. In reality, however, about 6° C./mm is the upper limit. If the gradient is still more increased, the crystal tends to become polycrystalline, hence it becomes no more single crystal. The ratio $G_c/G_e$ is preferably about 1.2 to 1.5; if it exceeds 1.8, strain may possibly result due to cooling.

If the above-mentioned temperature distribution can be obtained, the morphology of the hot zone is not particularly restricted. A method for obtaining such temperature distribution comprises, for example, disposing, around the single crystal being pulled up and at a certain distance from the melt surface, a heat shield having a structure such that the thickness thereof as seen in the horizontal direction is thicker in the lower part thereof and decreases toward the upper part and the distance from the single crystal increases toward the upper part. The lower part of the heat shield is made thicker so that the shielding of the radiation from the melt surface and the radiation from the heater and crucible surface can be more effective in the lower part. On the other hand, the heat shield is disposed at a distance from the melt surface so that the cooling of the single crystal surface just after pulling up can be retarded by the radiation from the melt surface and/or crucible surface to thereby reduce the temperature gradient in the surface portion.

Accordingly, when the lower end of the heat shield is positioned at a level where the single crystal surface temperature is about 1,370° C., the cooling of the single crystal surface portion just after solidification is made slow while the central portion of the single crystal is cooled in the manner of heat transfer by heat removal in the portion above the site of placement of the heat shield, so that a condition in which the temperature gradient is greater in the central portion than in the surface portion can be realized. The thickness of the heat shield is reduced and the distance from the single crystal increased toward above so that strain introduction due to excessive cooling can be prevented.

The temperature distribution within the single crystal can be determined by the technique of overall heat transfer analysis using a computer. However, for attaining the X region over the whole single crystal length, it is recommended that each apparatus be provided with such a hot zone as mentioned above, the single crystal pulling rate be changed continuously, the single crystal obtained be examined and an optimum pulling rate for the apparatus be selected, since the influence of the rate varies depending on the pulling apparatus used.

Wafers mainly consisting of the above X region, when subjected to heat treatment for oxide precipitate formation, can acquire oxide precipitates to serve as BMDs at a density of not less than $1 \times 10^4$/cm$^2$ as measured in a section. In particular for increasing the amount of these BMDs to secure a density of not less than $5 \times 10^4$/cm$^2$, it is desirable that the oxygen content in the single crystal be not less than 25 ppma. The heat treatment for oxide precipitate formation can be carried out by using, as an atmosphere, hydrogen, nitrogen, argon or a like gas, or a mixed composed of these or, further, an inert gas such as nitrogen or argon admixed with a small amount of oxygen and heating at a temperature of 600 to 1,100° C. for 1 minute to 24 hours. By doing so, it is possible to obtain wafers having almost no harmful grown-in defects on the surface and containing a sufficient number of BMDs within the inside.

For promoting oxide precipitation or for attaining thermal stability in the process of the above heat treatment for oxide precipitate formation, $0.5 \times 10^{16}$ to $15 \times 10^{16}$ atoms/cm$^3$ of carbon or $1 \times 10^{13}$ to $1 \times 10^{15}$ atoms/cm$^3$ of nitrogen may be added in the process of single crystal growth.

The wafers mainly consisting of the X region, when subjected to the so-called denuded layer formation heat treatment, can be converted to wafers having a denuded layer on the surface since that region close to the surface and intended for devices formation, namely the activation region, can readily be rendered defect-free. For this denuded layer formation heat treatment, two methods are available, one comprising heating at a high temperature of 1,000 to 1,380° C. in a nonoxidizing atmosphere for a prolonged period of time to thereby cause outward diffusion of oxygen and the other comprising heating by rapid temperature raising and lowering for a short period of time. Either method may be used.

In cases where there is a ring-forming OSF occurrence region around the X region of a wafer and if devices are formed in this region, the OSFs may manifest themselves under certain process conditions and may possibly deteriorate device characteristics. In such cases, the above-mentioned denuded layer formation heat treatment can make it possible to utilize the whole wafer surface efficiently.

By reducing the temperature raising rate in the temperature range of 600 to 1,100° C. in the process of temperature raising in the denuded layer formation heat treatment, it is possible to allow oxide precipitates to grow within the inside and thereby increase the BMD density simultaneously with the denuded layer formation on the surface.

The wafer of the present invention which mainly consists of the X region is also excellent as a substrate for forming an epitaxial layer on the surface thereof. The epitaxial layer formation can be carried out by the conventional method, whereby an epitaxial silicon wafer without any traces of laser scattering tomography defects can be obtained even when the epitaxial layer is thin.

The wafer, when subjected to the above-mentioned denuded layer formation heat treatment before or after epitaxial layer formation, can give an epitaxial silicon wafer excellent in gettering ability and free of defects in the activation region.

EXAMPLES

The effects of the present invention are explained based on the following specific examples (Examples 1 to 4).

Example 1

Figure 5:
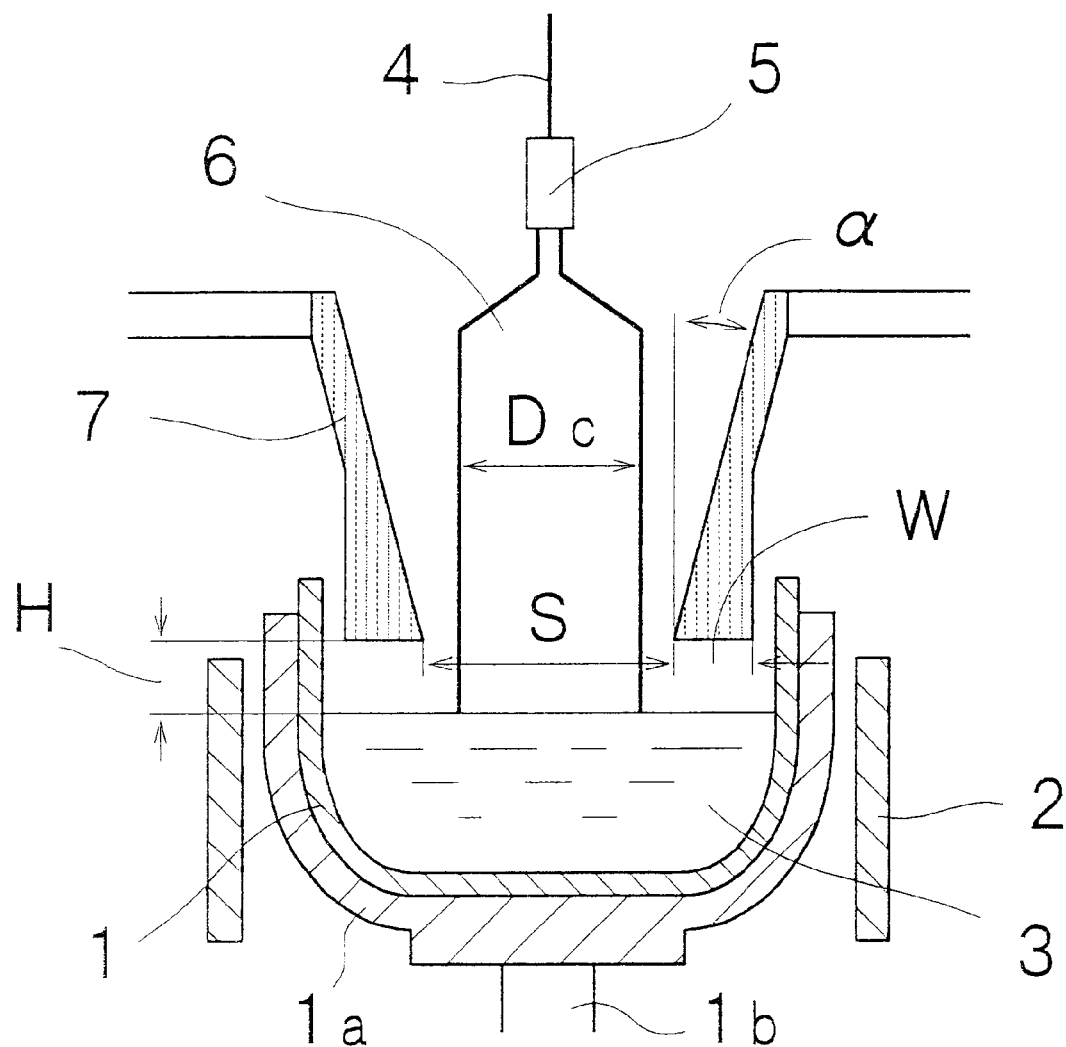
FIG. 5 is a schematic representation of an example of the apparatus for producing silicon single crystals as used in the examples.

Using an apparatus whose sectional structure was as schematically shown in FIG. 5, experiments were made to grow single crystals with an intended diameter of 210 mm and a body length of 1,000 mm. In this figure, the heat shield 7 had a structure such that the outer shell was made of graphite and the inside was filled with graphite felt. The outer diameter of the portion inserted in the crucible was 480 mm, the smallest diameter S at the lower end was 270 mm, the width W in the radial direction was 105 mm, and the inner surface had the shape of an inverse truncated cone beginning with the lower end, with an inclination of 21° against the vertical direction. The crucible 1 used had an inside diameter of 550 mm, the height H of the heat shield 7 from the melt surface at the lower end was 60 mm.

The crucible was charged with 120 kg of high purity polycrystalline silicon, and the p-type dopant boron was added so that the single crystal might have an electric resistance of about 10 Ωcm. The inside of the apparatus was in an argon atmosphere under reduced pressure, and the silicon was melted by heating with the heater 2 to give a melt 3. A seed crystal mounted on the seed chuck 5 was dipped in the melt 3 and then pulled up while rotating the crucible 1 and pulling shaft 4. The crystal orientation was made {100} and, after seed drawing for rendering the crystal dislocation-free, a shoulder section was first formed and the desired body diameter was attained by shoulder extension.

When the body length arrived at 300 mm, the pulling rate was adjusted to 1.0 mm/min and, thereafter, the pulling rate was decreased almost linearly according to the pull-up length, so that when the body length reached 600 mm, the rate became 0.3 mm/min. Thereafter, this pulling rate was maintained until completion of the growing. The temperature gradient in the axial direction in the temperature range from the melting point to 1,370° C. in this pulling up was 2.9 to 3.1° C./mm in the central portion (G) of the single crystal and 2.2 to 2.4° C./mm in the peripheral portion ($G_e$), and the ratio $G_c/G_e$ was about 1.3. This condition remained almost unchanged even when the pulling rate was varied.

The single crystal obtained was longitudinally sliced along the pulling axis, whereby a sheet-like test specimen including the vicinity of the pulling axis was prepared. This specimen was immersed in an aqueous solution of copper sulfate for Cu decoration, then subjected to heat treatment at 900° C. in a nitrogen atmosphere for 20 minutes and examined for the distribution of defects by X ray topography.

Figure 4:
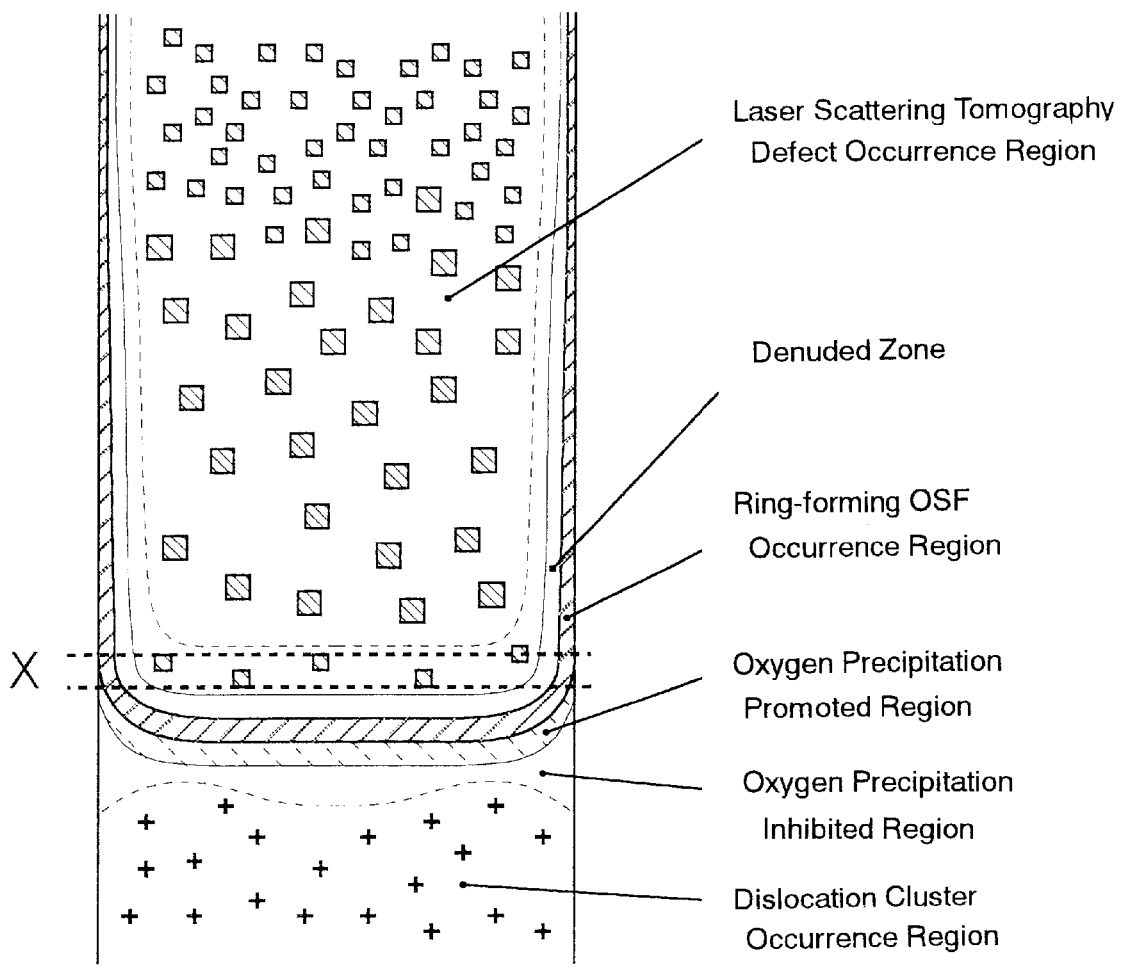
FIG. 4 is a schematic illustration of the relationship between the pulling rate and the sites of occurrence of crystal defects as observable when a single crystal is pulled up at $G_c$ of not less than 2.8° C./mm and $G_c/G_e$ of not less than 1.

As the results shown in FIG. 4 indicate, ring-forming OSFs occurred in an almost horizontal state. Above and adjacent to this OSF ring, a denuded zone was observed. Between this zone and the definite laser scattering tomography defect occurrence region, a region where minute laser scattering tomography defects seemed to exist at a low density was found out.

Therefore, a test specimen obtained from a site adjacent to the above mentioned test specimen was used and, after surface polishing, examined, by the OPP method, for the state of micro defects occurring between the ring-forming OSF occurrence region and laser scattering tomography defect occurrence region. Based on the results of this observation, the pulling rate range was selected, in which the X region free of large laser scattering tomography defects, with a mean defect size of not more than 0.1 μm and a density of defects exceeding 0.1 μm in size not more than $1 \times 10^5$ cm$^{-3}$, can account for at least 80% of the area of a section perpendicular to the pulling axis. While the intended diameter of the single crystal to be grown is 210 mm, wafer products are sliced from the crystal ground to a diameter of 200 mm for rounding, so that the above percentage 80% is the area ratio to these wafers.

From the results of the above investigation, it was found that the desired single crystal can be obtained at a pulling rate of 0.5 to 0.7 mm/min. As the pulling rate is reduced and approaches 0.5 mm/min, the ring-forming OSF occurrence region appears on the wafer periphery and, further, the oxygen precipitation promoted region also becomes included. When, on the other hand, the pulling rate is increased and approaches 0.7 mm/min, wafers almost 100% consisting of the X region can be obtained after rounding treatment but the possibility arises of laser scattering tomography defects large in size appearing.

Since the optimum conditions to be used in the single crystal growing apparatus were established from the above results, a single crystal almost wholly consisting of the X region was grown at an intended oxygen content of 26 ppma and a pulling rate of 0.6 mm/min. A wafer (X) was sliced from the middle part of the single crystal obtained and examined in the following manner.

Figure 3:
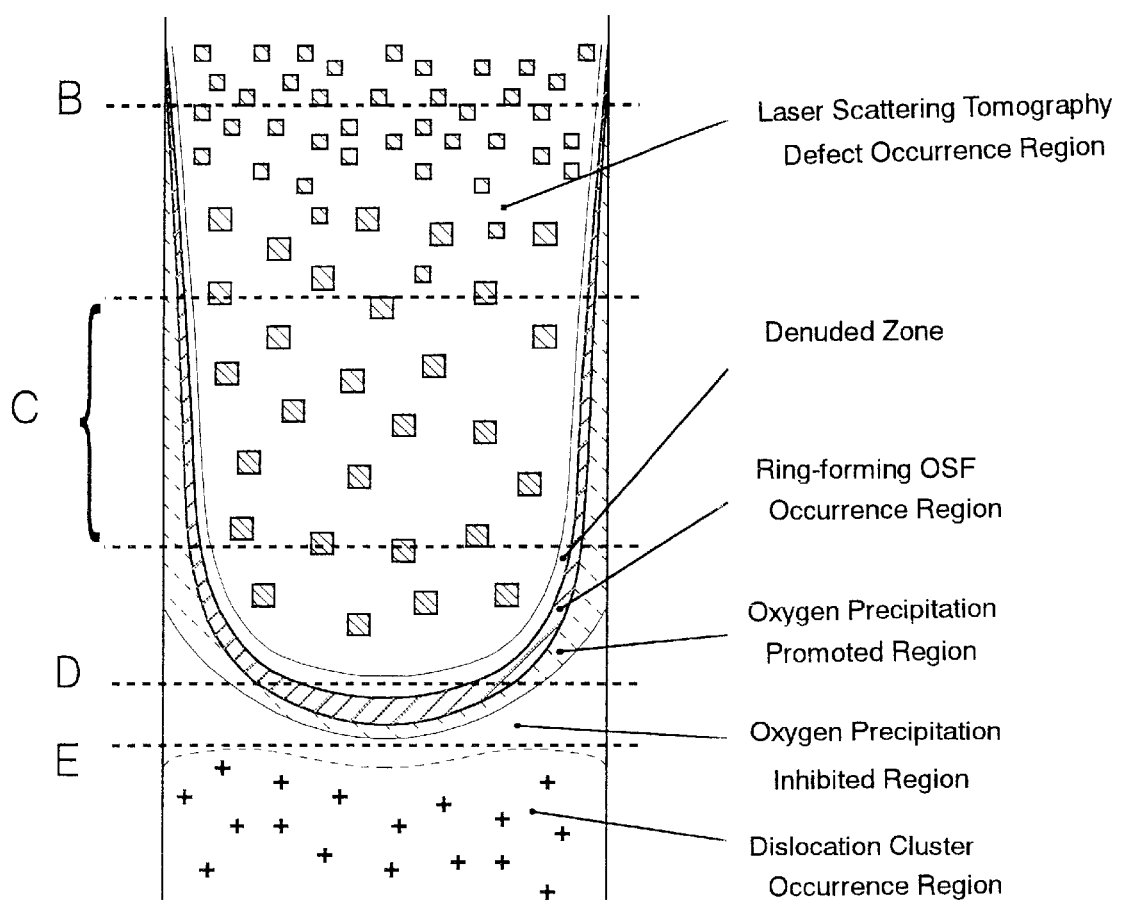
FIG. 3 is a schematic illustration of the relationship between the pulling rate and the sites of occurrence of crystal defects as observable when a single crystal is pulled up while the single crystal inside temperature gradient in the pulling axis direction is improved.

For comparison, a wafer (B) from a single crystal pulled at a pulling rate of 1.5 mm/min and cooled at a high rate as corresponding to the position B of the single crystal shown in FIG. 3, a wafer (C) from a conventional single crystal as corresponding to the position C and a wafer (E) from a defect-free single crystal as corresponding to the position E were prepared.

Figure 6:
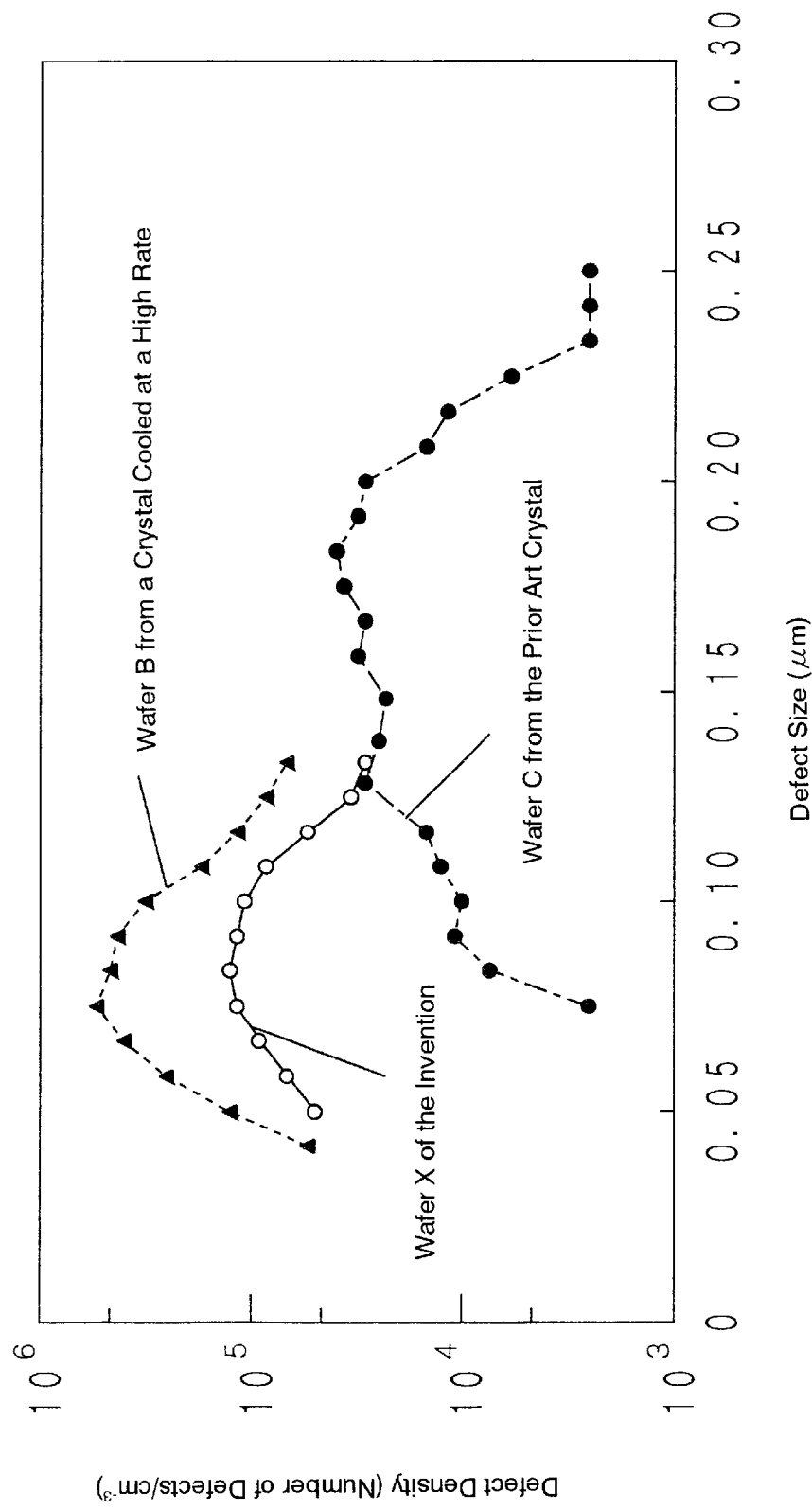
FIG. 6 is a graphic representation of the results obtained by investigating the relationship between the size of laser scattering tomography defects and the density of occurrence thereof.

The wafers B, C and X were measured for the size of laser scattering tomography defects and the density of occurrence thereof using the OPP apparatus. The results are shown in FIG. 6.

As is evident from these results, the wafer X of the present invention is smaller in defect size as compared with the conventional wafer C and comparable in defect size to but much lower in defect occurrence density than the wafer B cooled at a high rate.

Figure 7A:
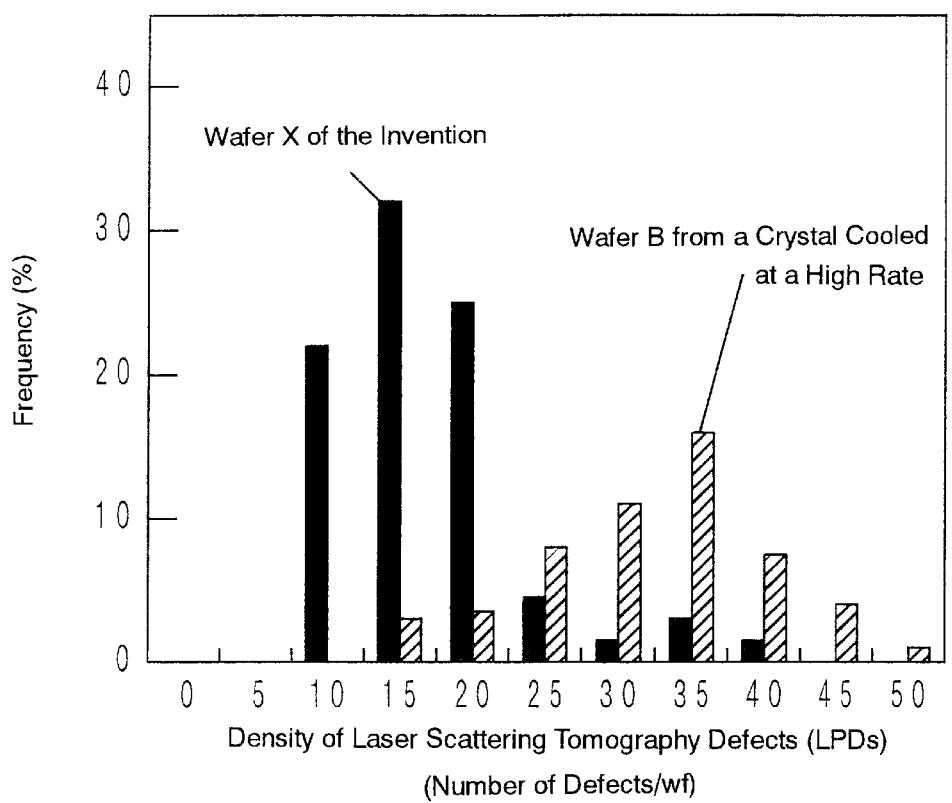
FIG. 7 is a graphic representation of the state of occurrence of light point defects (LPDs) occurring on the wafer surface and exceeding 0.1 μm in size.
Figure 7B:
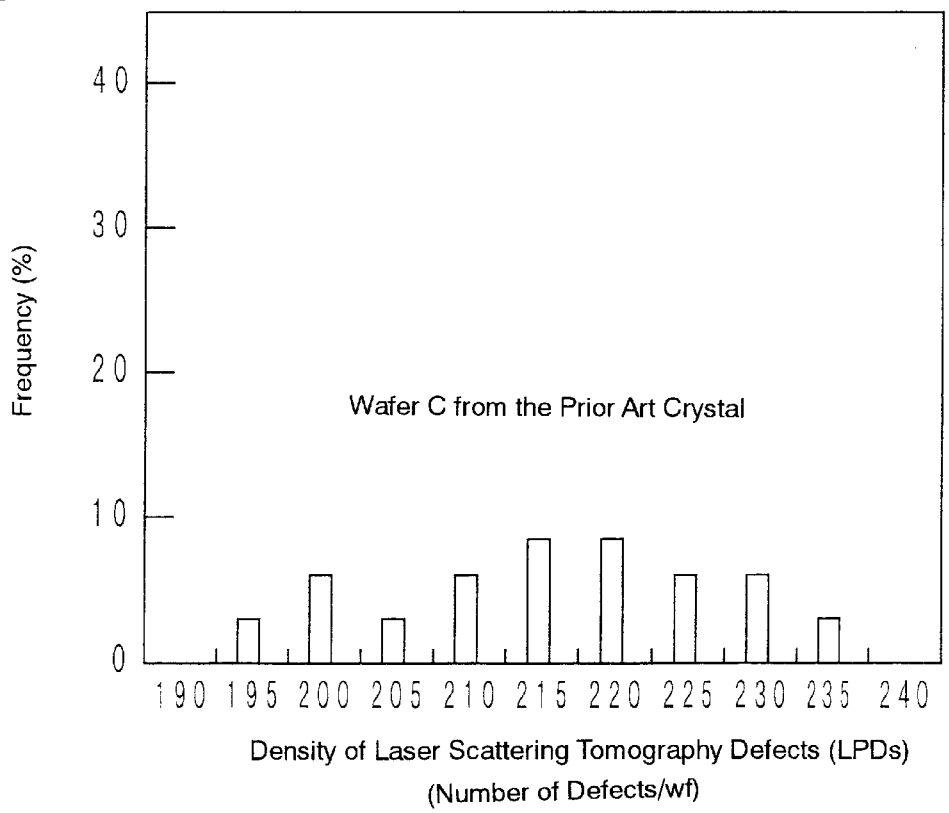

The density of light point defects (LPD), which are treated as identical to laser scattering tomography defects, was measured using a surface testing apparatus (KLA-Tencor Corporation model SP-1). The state of occurrence, on each wafer surface, of LPDs exceeding 0.1 μm in size is shown in FIG. 7. Referring to this figure, 100 wafers each of B, C and X were measured for the total number of defects occurring on each wafer surface and exceeding 0.1 μm in size (expressed as number/wf) and the number of wafers falling in the same defect frequency range is given for each range.

As is evident from the figure, the wafers X are very small in the number of large size defects as compared with the wafers C from the conventional crystal.

One hundred wafers each of the wafer species B, C and X were prepared and evaluated for time-zero dielectric breakdown (TZDB) under the following measurement conditions:

(a) Oxide film thickness: 25 nm
(b) Electrode surface area: 8 mm$^2$
(c) Measuring electrode: phosphorus-doped polysilicon
(d) Judging current: 1 mA/cm$^2$
(e) Conforming product judgment criterion: dielectric breakdown electric field of not less than 11 MV/cm.

Figure 8A:
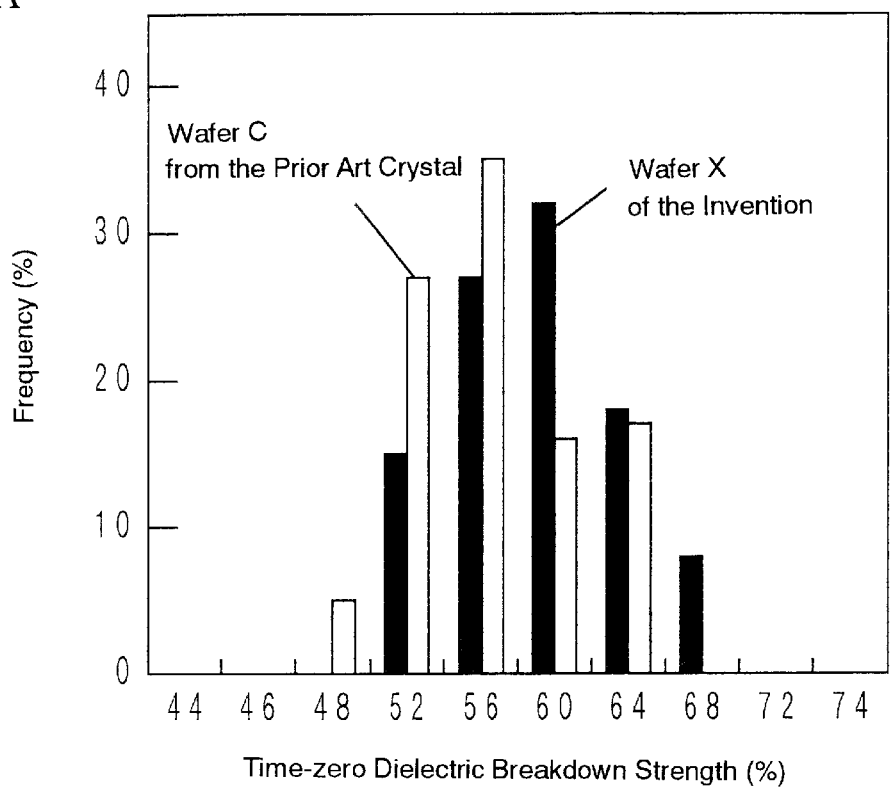
FIG. 8 is a graphic representation of the results of measurement of wafers for time-zero dielectric breakdown.
Figure 8B:
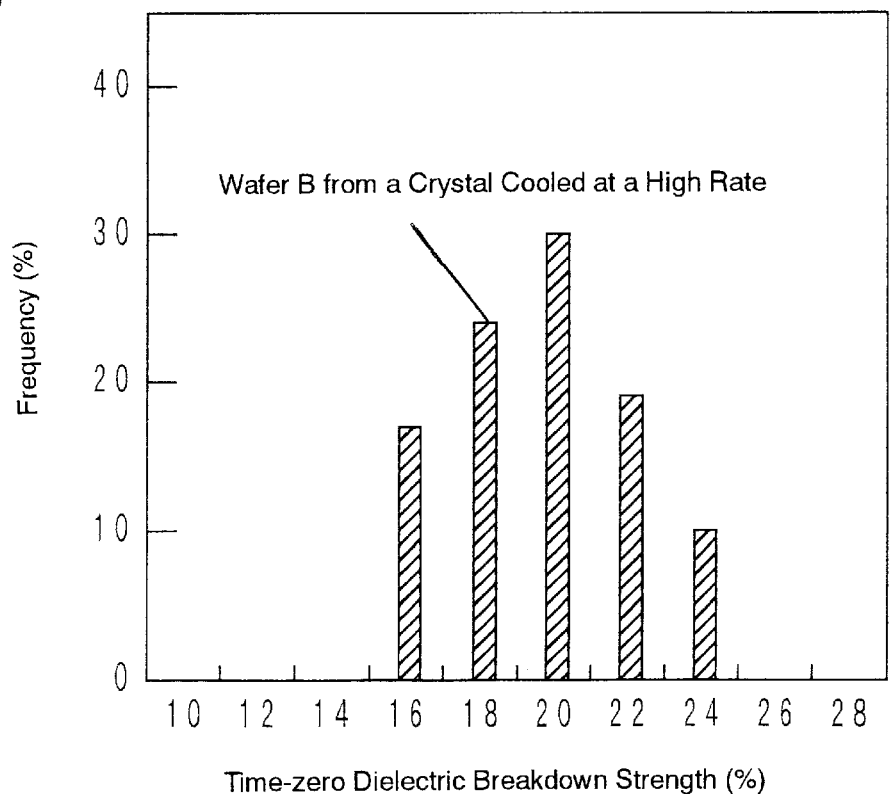

The evaluation results are shown in FIG. 8 in terms of time-zero dielectric breakdown distribution (occurrence frequency). The wafers B taken from the single crystal cooled at a high rate are much inferior in time-zero dielectric breakdown behavior. The wafers C and X give good time-zero dielectric breakdown evaluation results but the wafers X of the invention are superior.

For investigating the density of oxide precipitates formed within the wafer, wafers X and E were used and subjected to 4 hours of heating at 800° C. in an oxidizing atmosphere and then to 16 hours of heat treatment at 1,000° C. Then, each wafer was subjected to cleavage fracture and, after wright etchant treatment (chromic acid etching), the cleavage surface was observed under an optical microscope and the inside oxide precipitate density was measured. The results are shown in FIG. 9.

Figure 9:
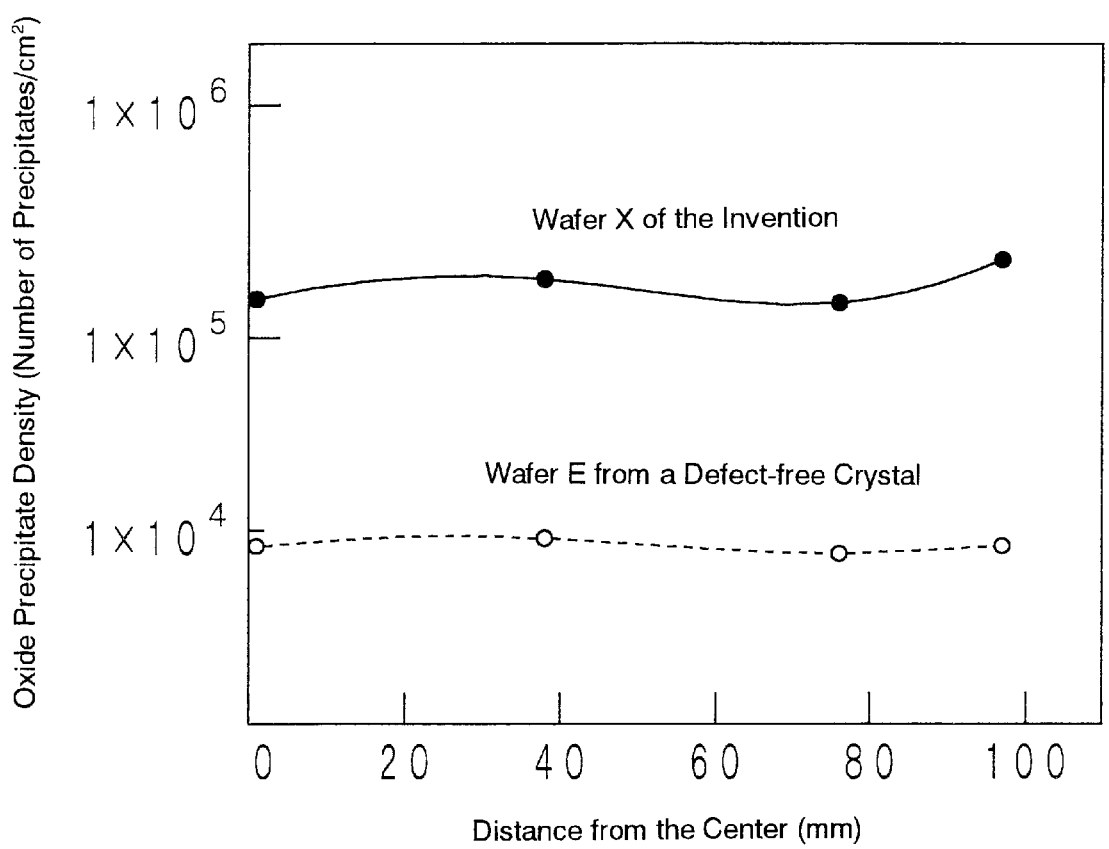
FIG. 9 is a graphic representation of the results of measurement of wafers for oxide precipitate density.

As is evident from FIG. 9, oxide precipitates, which are BMDs, are observed at a density of $1.1 \times 10^5/\text{cm}^2$ on the observation surface of the wafer X nearly uniformly in the radial direction of the single crystal while, with the wafer E, oxide precipitates were observed only at a density of about $8 \times 10^3/\text{cm}^2$.

It is thus seen that the silicon wafer according to the invention is small in the size of laser scattering tomography defects and low in the density thereof, shows good time-zero dielectric breakdown characteristic, allows a sufficient number of BMDs to be formed therewithin and thus is excellent in gettering capability.

Example 2

Using the same wafer X as described above in Example 1, a wafer with oxide precipitates formed therein was prepared by 2 hours of heating at 780° C. in a nitrogen gas atmosphere containing 30% of oxygen, followed by 8 hours of heat treatment at 1,000° C. The cleavage surface of this wafer was observed and oxide precipitates, which are BMDs, were observed at a density of $1.1 \times 10^5/\text{cm}^2$. This wafer was examined for surface grown-in defects, time-zero dielectric breakdown, gettering capability and, further, characteristics of devices formed and conforming product percentage and so forth. As a result, it was confirmed that it was superior to the conventional wafers.

Example 3

The same wafer X according to the invention as shown in Example 1 and the same prior art wafer C for comparison were used and subjected to 1 hour of heating treatment at 1,200° C. in a high-purity hydrogen gas atmosphere at a temperature increasing or decreasing rate of 3° C./min. After subjecting the treated wafers to SC-1 washing (washing with a mixed solution composed of aqueous ammonia, aqueous solution of hydrogen peroxide and ultrapure water=1:1:15), they were measured for the density of defects having a size not smaller than 0.8 μm using a surface testing apparatus (KLA-Tencor model SP-1). After surface observation, the 1-μm-thick wafer surface layer was polished off using a mirror polishing machine and, after SC-1 washing, the new surface was examined for the defects mentioned above. This procedure was repeated and the thickness of the denuded layer formed on the surface was measured.

As a result, the wafer C was found to have a 2- to 3-μm-thick denuded layer whereas the wafer X was confirmed to have a denuded layer formed to a depth of 20 μm from the surface.

Similarly, the same wafer X of the invention as shown in Example 1 and the prior art wafer C were subjected to 1 minute of rapid thermal annealing (RTA) at 1,280° C. in an argon atmosphere using a rapid heating/cooling apparatus with a halogen lamp light source. The wafers after RTA were examined for the depth of the surface denuded layer by the same technique as mentioned above. As a result, the wafer C had a 1-μm-thick denuded layer while the wafer X had a denuded layer formed with a thickness of 10 μm from the surface.

In that manner, the wafer of the invention can be easily provided with a thick denuded layer to give a defect-free wafer. This is probably due to the fact that the laser scattering tomography defects are small in size and therefore can easily be dissolved and caused to vanish in the matrix.

Example 4

Five wafer species, namely the same wafer X as used in Example 1, a wafer W obtained in Example 2 by oxide precipitation treatment of X, a wafer Y obtained in Example 3 by further heat treatment of the wafer W in hydrogen, a wafer Z obtained by further heat treatment of the wafer W in hydrogen as in Example 3, and the prior art wafer C for comparison, were used and subjected to 30 seconds of heat treatment at 1,200° C. in a hydrogen atmosphere. Then, SiHCl$_3$ in the form of a gas was introduced and an epitaxial layer was formed at a deposition temperature of 1,100° C. to a thickness of about 1 μm.

The epitaxial wafer surfaces obtained were measured for the density of defects having a size of not less than 0.11 μm using a surface testing apparatus.

For the prior art wafer C, 1,000 laser scattering tomography defects per wafer were observed on an average on the surface epitaxial layer, whereas no traces of such defects could be found on the wafers X, Y and Z. On the wafer W, some stacking faults presumably due to oxide precipitates were observed. On the wafer Z derived from that wafer W by further denuded layer formation treatment, however, no such defects were found.

Further, when the wafers X and Y were subjected to such oxide precipitation formation treatment as in Example 2 following epitaxial layer formation, the formation of not less than $1 \times 10^4$ BMDs per cm$^2$ therewithin could be confirmed.

In this way, by using the wafer of the present invention, it is possible to obtain a defect-free epitaxial wafer excellent in gettering capability even when the epitaxial layer is thin.

As explained hereinabove, the wafer of the present invention is small in the size of laser scattering tomography defects and low in the density of occurrence thereof and, further, oxide precipitates serving as BMDs can be formed readily and sufficiently therewithin upon heat treatment. Furthermore, when the wafer is used as the substrate for an epitaxial water, a defect-free wafer excellent in gettering effect can be produced with ease.

What is claimed is:

1. A silicon wafer sliced from a silicon single crystal pulled up by the Czochralski method, characterized in:
   that the laser scattering tomography defect occurrence region accounts for at least 80% of the wafer surface area,
   that the laser scattering tomography defects have a mean size of not more than 0.1 μm and
   that the density of those laser scattering tomography defects which exceed 0.1 μm in size is not more than $1 \times 10^5$ cm$^3$.

2. A silicon wafer as claimed in claim 1 which has an oxygen concentration of not less than 25 ppma (OLD ASTM).

3. A silicon wafer as claimed in claim 1 which has an oxide precipitate density, as measured on a section, of not less than $1 \times 10^4$/cm$^2$ as resulting from heat treatment for oxide precipitate formation.

4. A silicon wafer as claimed in claim 2 which has an oxide precipitate density, as measured on a section, of not less than $1 \times 10^4$/cm$^2$ as resulting from heat treatment for oxide precipitate formation.

5. A silicon wafer as claimed in claim 1 which has a denuded layer on the surface as resulting from heat treatment for denuded layer formation.

6. A silicon wafer as claimed in claim 2 which has a denuded layer on the surface as resulting from heat treatment for denuded layer formation.

7. An epitaxial silicon wafer which comprises an epitaxial layer formed on the surface of a silicon wafer as defined in claim 1.

8. An epitaxial silicon wafer which comprises an epitaxial layer formed on the surface of a silicon wafer as defined in claim 2.

9. An epitaxial silicon wafer which comprises an epitaxial layer formed on the surface of a silicon wafer as defined in claim 3.

10. An epitaxial silicon wafer which comprises an epitaxial layer formed on the surface of a silicon wafer as defined in claim 4.

11. An epitaxial silicon wafer which comprises an epitaxial layer formed on the surface of a silicon wafer as defined in claim 5.

12. An epitaxial silicon wafer which comprises an epitaxial layer formed on the surface of a silicon wafer as defined in claim 6.

13. An epitaxial silicon wafer which comprises an epitaxial layer formed on the surface of a silicon wafer as defined in claim 1 and has an oxide precipitate density, as measured on a section, of not less than $1 \times 10^4$/cm$^2$ as resulting from heat treatment for oxide precipitate formation within the wafer following epitaxial layer formation.

14. An epitaxial silicon wafer which comprises an epitaxial layer formed on the surface of a silicon wafer as defined in claim 2 and has an oxide precipitate density, as measured on a section, of not less than $1 \times 10^4$/cm$^2$ as resulting from heat treatment for oxide precipitate formation within the wafer following epitaxial layer formation.

15. An epitaxial silicon wafer which comprises an epitaxial layer formed on the surface of a silicon wafer as defined in claim 5 and has an oxide precipitate density, as measured on a section, of not less than $1 \times 10^4$/cm$^2$ as resulting from heat treatment for oxide precipitate formation within the wafer following epitaxial layer formation.

16. An epitaxial silicon wafer which comprises an epitaxial layer formed on the surface of a silicon wafer as defined in claim 6 and has an oxide precipitate density, as measured on a section, of not less than $1 \times 10^4$/cm$^2$ as resulting from heat treatment for oxide precipitate formation within the wafer following epitaxial layer formation.

17. A silicon wafer sliced from a silicon single crystal produced by pulling by the Czochralski method under pulling conditions such that while the temperature of the central portion of the single crystal being pulled up from the melt is within the range from the melting point to 1,370° C., the temperature gradient $G_c$ in the central portion in the single crystal pulling axis direction is not less than 2.8° C./mm and the ratio $G_c/G_e$, where $G_e$ is the temperature gradient in the peripheral portion in the pulling axis direction, is not less than 1, said silicon wafer being further characterized in:
   that the laser scattering tomography defect occurrence region accounts for at least 80% of the wafer surface area,
   that the laser scattering tomography defects have a mean size of not more than 0.1 μm and
   that the density of those laser scattering tomography defects which exceed 0.1 μm in size is not more than $1 \times 10^5$ cm$^{-3}$.

18. A silicon wafer sliced from a silicon single crystal produced by pulling by the Czochralski method under pulling conditions such that while the temperature of the central portion of the single crystal being pulled up from the melt is within the range from the melting point to 1,370° C., the temperature gradient $G_c$ in the central portion in the single crystal pulling axis direction is not less than 2.8° C./mm and the ratio $G_c/G_e$, where $G_e$ is the temperature gradient in the peripheral portion in the pulling axis direction, is not less than 1, said silicon wafer being further characterized in:
   that the laser scattering tomography defect occurrence region accounts for at least 80% of the wafer surface area,
   that the laser scattering tomography defects have a mean size of not more than 0.1 μm,
   that the density of those laser scattering tomography defects which exceed 0.1 μm in size is not more than $1 \times 10^5$ cm$^{-3}$ and that it has an oxygen concentration of not less than 25 ppma (OLD ASTM).

* * * * *

UNITED STATES PATENT AND TRADEMARK OFFICE
CERTIFICATE OF CORRECTION

PATENT NO.    : 6,569,535 B2
DATED         : May 27, 2003
INVENTOR(S)   : Murakami et al.

It is certified that error appears in the above-identified patent and that said Letters Patent is hereby corrected as shown below:

<u>Title page,</u>
Item [73], Assignee, change "Sumitomo Metal Industries, Ltd., Osaka (JP)" to
-- Sumitomo Mitsubishi Silicon Corporation, Tokyo (JP) --

Signed and Sealed this

Fourteenth Day of October, 2003

JAMES E. ROGAN
*Director of the United States Patent and Trademark Office*